(12) United States Patent  
Kirsten et al.

(10) Patent No.: US 7,919,345 B1
(45) Date of Patent: Apr. 5, 2011

(54) METHOD OF FABRICATING MICROMECHANICAL COMPONENTS WITH FREE-STANDING MICROSTRUCTURES OR MEMBRANES

(75) Inventors: Mario Kirsten, Potsdam (DE); Peter Lange, Berlin (DE); Beatrice Wenk, Berlin (DE); Werner Riethmueller, Berlin (DE)

(73) Assignee: Fraunhofer-Gesellschaft zur Forderung der angewandten Forschung e.V. (DE)

( * ) Notice: Subject to any disclaimer, the term of this patent is extended or adjusted under 35 U.S.C. 154(b) by 0 days.

(21) Appl. No.: 08/849,036

(22) PCT Filed: Nov. 21, 1995

(86) PCT No.: PCT/DE95/01650
§ 371 (c)(1),
(2), (4) Date: Jul. 2, 1997

(87) PCT Pub. No.: WO96/16203
PCT Pub. Date: May 30, 1996

(30) Foreign Application Priority Data

Nov. 22, 1994 (DE) .................................. P 44 41 541
Dec. 17, 1994 (DE) .................................. P 44 45 177

(51) Int. Cl.
*H01L 21/00* (2006.01)
(52) U.S. Cl. .............. 438/50; 438/52; 438/53; 438/488; 438/723
(58) Field of Classification Search .................. 438/50, 438/52, 53
See application file for complete search history.

(56) References Cited

U.S. PATENT DOCUMENTS

| 4,559,219 | A | * | 12/1985 | Herrick ........................ 423/350 |
| 4,897,360 | A |   | 1/1990  | Guckel et al. .................... 437/7 |
| 4,963,506 | A |   | 10/1990 | Liaw et al. ..................... 437/101 |
| 5,013,954 | A |   | 5/1991  | Shibaike et al. ............... 310/309 |
| 5,059,556 | A | * | 10/1991 | Wilcoxen ........................ 438/52 |
| 5,164,339 | A | * | 11/1992 | Gimpelson ...................... 438/52 |
| 5,587,343 | A | * | 12/1996 | Kano et al. ..................... 438/52 |
| 5,616,523 | A | * | 4/1997  | Benz et al. ..................... 438/50 |
| 5,750,420 | A | * | 5/1998  | Bono et al. ..................... 438/52 |
| 5,753,134 | A | * | 5/1998  | Biebl ............................. 438/52 |

(Continued)

FOREIGN PATENT DOCUMENTS

DE 42 11 970 A1 10/1992

(Continued)

OTHER PUBLICATIONS

*Dampfmashine en miniature*; Elektronik, Bd. 43, Nr. 19, Sep. 20, 1994; Seite 8 XP 000473199 'Announcement'.

(Continued)

*Primary Examiner* — Zandra Smith
*Assistant Examiner* — Khanh B Duong
(74) *Attorney, Agent, or Firm* — Renner Kenner Greive Bobak Taylor & Weber

(57) ABSTRACT

A method is disclosed of fabricating micromechanical components provided with free-standing microstructures or membranes with predetermined mechanical stress, by initially depositing a sacrificial layer on a substrate followed by depositing a polysilicon layer on the sacrificial layer by a gaseous phase deposition and, finally, at least partial removal of the sacrificial layer. During deposition of the polysilicon layer, the process pressure selected determined the type of stress in the polysilicon layer, and the value of the stress is set by the process temperature selected. The process pressure is above the pressure range used in LPCVD reactors.

14 Claims, 3 Drawing Sheets

Figure 1:
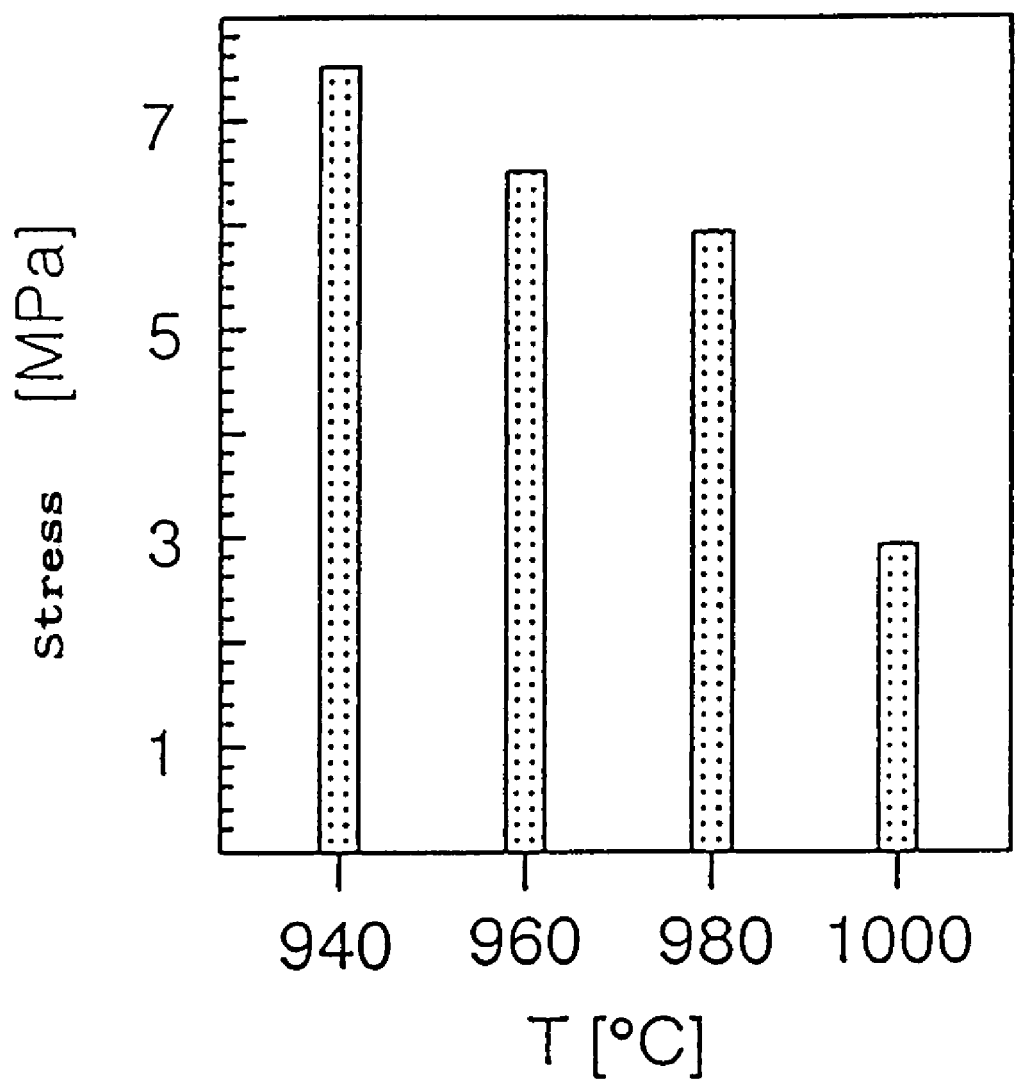

U.S. PATENT DOCUMENTS 5,851,851 A * 12/1998 Uenoyama et al. ............. 438/50
5,922,212 A *  7/1999 Kano et al. ........................ 216/2

FOREIGN PATENT DOCUMENTS

JP  06-160207  11/1992
WO  WO 93/11276  6/1993

OTHER PUBLICATIONS

*Low-temperature selectrive epitaxial grown of silicon at atmospheric pressure*; Sedgwick et al; Appl. Phys. Lett. 54 (26), Jun. 26, 1989; pp. 2689-2691.

*The Deformation of Polycrystalline-Silicon Deposited on Oxide-covered Single Crystal Silicon Substrates*; Suzuki et al.; J. Electrochem. Soc.: Solid-State Science and Technology, Bd. 124, 1977, S. 1776-1780.

*Surface micromachining for microsensors and microactuators*; Roger T. Howe; J. Vac. Sci. Technol. B6 (6); Nov./Dec. 1988; pp. 1809-1813.

*Fine Grained Polysilicon and Its Application to Planar Pressure Transducers*; Guckel et al.; Techn. Digest, 4$^{th}$ Int. Conf. Solid-State Sensors and Actuators (Transducers 87), Tokyo, Japan, Jun. 2-5, 1987, pp. 277-282.

*Stress In Undoped LPCVD Ploycrystalline Silicon*; Krulevitch et al.; Techn. Digest, 6$^{th}$ Int. Conf. Solid-State Sensors and Actuators (Transducers 91), San Francisco, Jun. 23-27, 1991, pp. 949-952.

*Structure of Chemically Deposited Ploycrystalline-Silicon Films*; Kamins et al.; Thin Solid Films, Bd. 16, 1973, pp. 147-165.

*Technologie hochintegrierter Schaltungen*; Widmann et al., Springer Verlag, 1988, Seite 35.

*Mechanical Stresses in Low Pressure Chemically Vapour Deposited Silicon Films*; Koleshko et al.; Thin Solid Films, 165 (1988) Preparation and Characterization; pp. 181-191.

*Mechanical Properties of Fine Grained Polysilicon The Repeatability Issue*; Guckel et al.; 1988 Solid State Sensor and Actuator Workshop, Hilton Head Island SC, Jun. 6-9, 1988, pp. 96-99.

* cited by examiner

▲ Vacuum Pressure Deposition
• Normal Pressure Deposition a)

b)

c)

METHOD OF FABRICATING MICROMECHANICAL COMPONENTS WITH FREE-STANDING MICROSTRUCTURES OR MEMBRANES

BACKGROUND OF THE INVENTION

1. Field of the Invention

The invention relates to a method of fabricating micromechanical components with free-standing microstructures or membranes under predeterminable mechanical stresses.

2. The Prior Art

Aside from bulk micromachining in which three-dimensional structures are etched out of a wafer by anisotropic selective etching solutions, so-called surface micromachining has gained ever increasing significance. With this technology, free-standing moveable microstructures may be fabricated on a substrate surface. Sandwich systems of distinct layers which may be etched with respect of each other form the basis for these structures. After structuring of the uppermost layer (e.g. of polysilicon) the sacrificial layer positioned beneath it (e.g. silicon dioxide) is removed by a wet chemical process, so that free-standing structures are formed which may be shaped like bridges or tongues.

The material chiefly used for these mechanical structures is polycrystalline silicon (polysilicon). The layer thicknesses of the polysilicon layers required for this purpose range between several μm up to several 10 μm.

Polysilicon layers are also used in electronic components. In that case, the required layer thicknesses are in the range of several 100 nm at a maximum. The layers are precipitated in low pressure chemical vapor deposition (LPCVD) reactors. However, the LPCVD reactors have relatively low layer precipitation rates of about 20 nm/min. In these systems, the layer thickness attainable within acceptable process intervals is, therefore, limited to about 2 μm. Hence, for applications requiring layer thicknesses of up to several 10 μm, this precipitation process is not suitable.

A further disadvantage of polysilicon layers fabricated in these systems resides in the resulting mechanical stress in the polysilicon. The standard process temperatures utilized in microelectronics range between 630° C. and 650° C. At these temperatures, the precipitated polysilicon layer is always subject to compressive stress (see, e.g., H. Guckel et al., Tech. Digest, 4th Int. Conf. Solid-State Sensors and Actuators (Transducers 87), Tokyo, 2-5 Jun. 1987, pp. 277). However, in many areas of application of micromechanics it is tensile stresses which are desired in the material, since compressive stress leads to buckling of membranes or bridge structures, for instance.

A known process for fabricating polysilicon layers with tensile stresses as described by H. Guckel et al., 1988, Solid State Sensor & Actuator Workshop, Hilton Head Island, S.C., 6-9 Jun. 1988, pp. 96, involves precipitation of the silicon at temperatures below 580° C. At these temperatures, the precipitated layer is not polycrystalline but more or less amorphous. A subsequent temperature treatment at 900° C. leads to crystallization. The rearrangement of the silicon atoms taking place in this process is accompanied by a volume contraction which, in turn, leads to tensile stresses within the material.

On the other hand, if annealing is thereafter undertaken at temperatures in excess of 1,000° C., the tensile stresses will be converted again into compressive stresses.

A further process of controlling stress in a layer of LPCVD polysilicon is described by P. Kruvelitch et al., Tech. Digest, 6th Int. Conf. Solid State Sensors and Actuators (Transducers 91), San Francisco, 23-27 Jun. 1991, pp. 949. By appropriately selecting the precipitation temperature, tensile stress (T about 605° C.) or compressive stress (T>620° C.) is generated in the layer.

Different tests have shown, however, that the tension values generated in the polysilicon layer by the mentioned processes can only be poorly reproduced. Moreover, the layer thickness which may be obtained within reasonable processing times is limited to about 2 μm, so that such processes are not suitable for free-standing structures requiring layer thicknesses up to several 10 μm.

A process of making thick polysilicon layers (1-15 μm) is known from T. I. Kamins et al., Thin Solid Films, 16, 147 (1973), in which the polysilicon is precipitated by gaseous phase deposition (CVD) (as compared to LPCVD) at increased pressure. Deposition rates of 60-500 nm/min are obtained by this process, so that polysilicon layers having a thickness of 15 μm may be fabricated.

No indication is given, however, in which manner the stresses in the polysilicon layers may be affected during deposition.

OBJECT OF THE INVENTION

It is, therefore, an object of the invention to provide a method of fabricating micromechanical components with free-standing microstructures or membranes under predeterminable mechanical stresses.

BRIEF SUMMARY OF THE INVENTION

The object is accomplished in accordance with the invention by the characteristics hereinafter described in greater detail.

In the method in accordance with the invention, the polysilicon is deposited as the material for the free-standing microstructure or membrane at a process pressure (e.g. $2.7 \times 10^3$ Pa or atmospheric pressure) which is higher than that used in the LPCVD process. The type of layer stress (i.e. tensile or compressive stress) of the polysilicon layer and, hence, of the free-standing microstructure or membrane, may be set by an appropriate selection of the process pressure. The value of the layer stress is determined by the selected process temperature. Thus, at a process temperature of 1,000° C. and a pressure of $10.6 \times 10^3$ Pa, for instance, tensile stress of about 3 MPa may be generated in the polysilicon layer, whereas compressive stress in the polysilicon layer is generated at the same process temperature and process pressure at atmospheric pressure. At the same process pressure (e.g., $10.6 \times 10^3$ Pa) different values of layer tension may be set by process temperature selection, such as, for example 3 MPa at 1,000° C. as compared to 7.5 MPa at 940° C. In general, higher temperatures result in lower stresses.

By the method in accordance with the invention, precipitation rates of several 100 nm/min are obtained, so that it is possible, within reasonable process times (<20 min) to fabricate thick polysilicon layers (=10 μm) for forming free-standing structures or membranes.

A special advantage of the method in accordance with the invention resides in the fact that simply by varying the precipitation parameters pressure and temperature, the value and type of layer stress may be reproducibly set from compressive stresses to tensile stresses. In this manner, free-standing microstructures or membranes with predeterminable mechanical stresses may be fabricated.

Moreover, the method may be practiced without refurbishing known reactors, particularly in batch or single wafer polysilicon or monosilicon (epitaxy) reactors. In these reactors, the process temperatures may without difficulty be varied in the range from 600-1,200° C. High gas flows in the range of, e.g., 200-1,200 sccm/min may be set.

An oxide layer prevents the formation of monocrystalline silicon during precipitation of polysilicon on a silicon wafer. To improve the nucleation, a thin LPCVD polysilicon layer may initially be deposited on the oxide layer. Substrates of ceramics, quartz or other materials may also be used.

In an improvement of the method in accordance with the invention, the conductivity of the polysilicon layer is improved by admixing defined quantities of gases containing boron or phosphorus (e.g. phosphine ($PH_3$)) to the reaction gas. Layer resistances (the layer resistance in $\Omega/\square$ is the result of integrating the conductance over the depth of the polysilicon layer) between 10$\Omega/\square$ to several k$\Omega/\square$ may be generated by such in situ doping. In this manner, the polysilicon material is rendered electrically conductive, and the evaluation of, or the activation by, electrical signals of sensors and actuators is made possible.

Additional layers with high internal tensile stresses may be deposited above and/or below the polysilicon layer to generate high prestresses, e.g. for improving the stiffness of the membranes.

DESCRIPTION OF THE SEVERAL DRAWINGS

Figure 2:
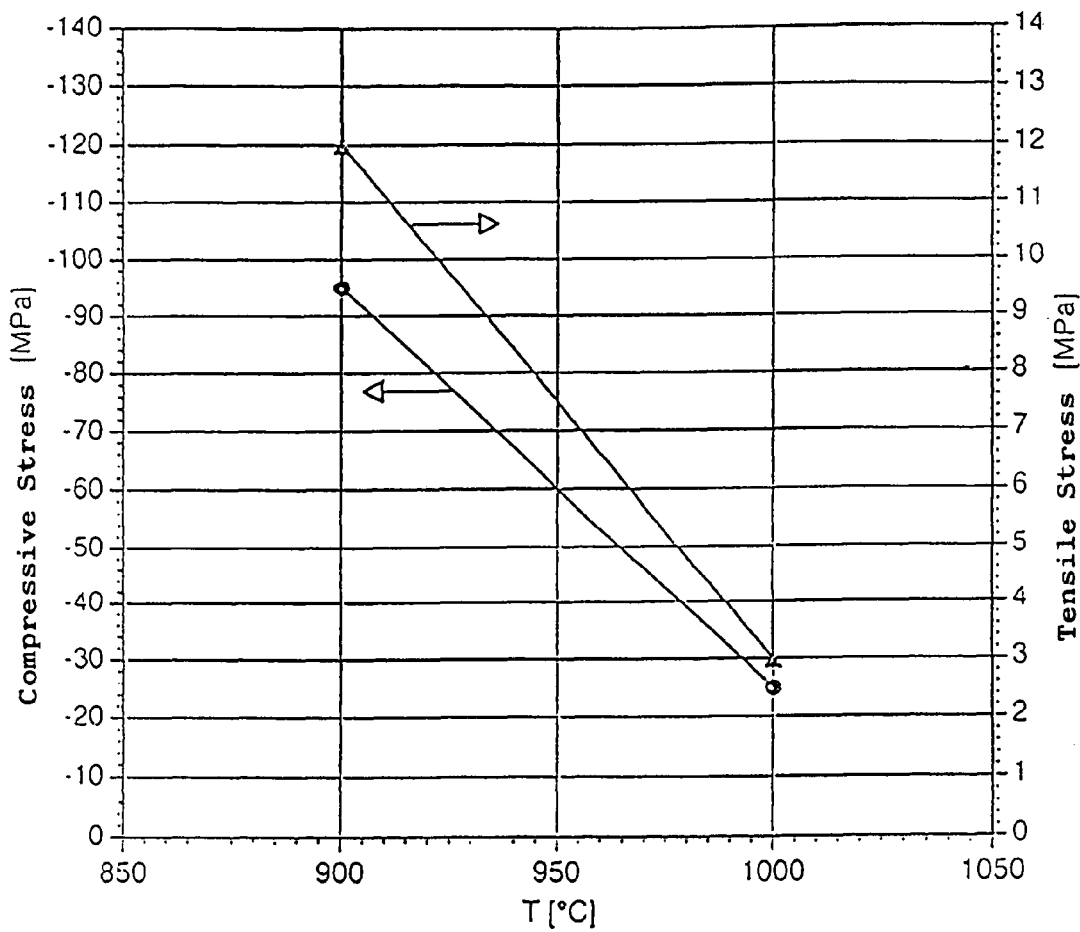
Figure 3:
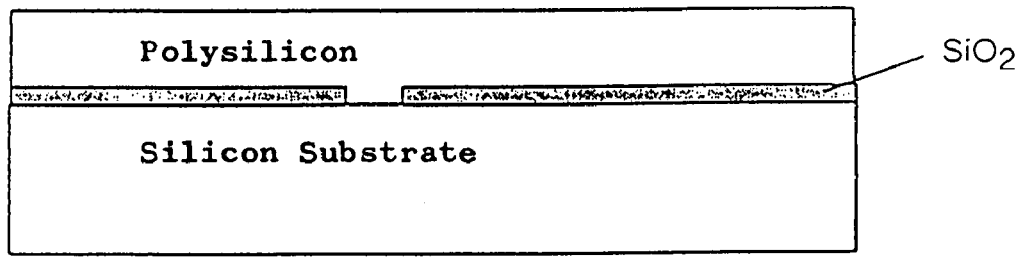
Figure 3:
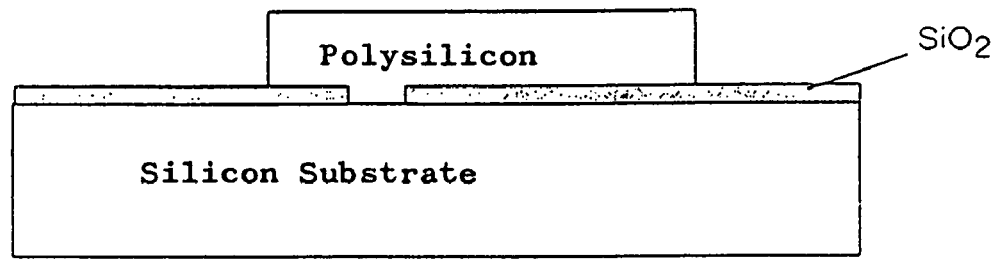
Figure 3:
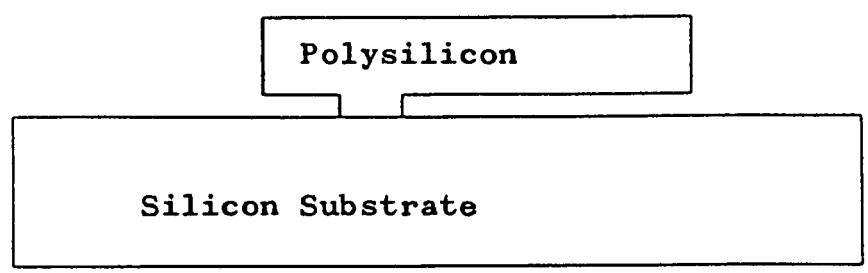

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 1: depicts stress values (tensile stress) of polysilicon layers which have been precipitated at different process temperatures and at vacuum pressure;

FIG. 2: depicts stress values of polysilicon layers in dependence of the process temperature at different process pressure values; and FIG. 3: schematically depicts a process cycle for fabricating micromechanical structures from polysilicon.

DETAILED DESCRIPTION OF PREFERRED EMBODIMENTS

An example of different tensile stresses of polysilicon layers deposited by the method in accordance with the invention at vacuum pressure (here: 10.6×10$^3$ Pa) is shown in FIG. 1. The dependence of the stress values on process temperature may be clearly seen. In a temperature range between 940° C. and 1,000° C. the tension varies between about 7.5 MPa and 3 MPa.

FIG. 2 depicts the dependence of internal stresses of polysilicon layers deposited in accordance with the invention on process temperature (shown in solid line) at two different process pressure settings. As the process temperatures are increased, the stress values of the polysilicon layers drop in respect of both compressive as well as tensile stresses. Low value tensile stresses are generated at vacuum pressure precipitation (10.6×10$^3$ Pa; shown by solid triangles), as contrasted to compressive stresses up to 0.1 GPA at normal pressure (atmospheric pressure; depicted by filled circles).

An embodiment of fabricating a micromechanical component having a free-standing structure of polysilicon will be explained with reference to FIG. 3.

A typical layer structure consists of a silicon substrate with a sacrificial layer of silicon dioxide ($SiO_2$) upon which a polysilicon layer is applied (FIG. 3a). The polysilicon layer of 10 μm thickness is precipitated in an epitaxy batch reactor at a high gas flow, using dichlorosilane ($SiH_2Cl_2$), silicon tetrachloride ($SiCl_4$), trichlorosilane ($SiHCl_3$) or Silane ($SiH_4$) as the reaction gas. To generate tensile stress of less than 10 MPa in the polysilicon layer, precipitation is carried out at vacuum pressure (about 10.6×10$^3$ Pa) and process temperatures between 960° C. and 1,040° C. The required high rate of precipitation of about 500 nm/min (at a process temperature of 1,000° C.) occurs here as well, so that a polysilicon layer 10 μm thick will be precipitated within 20 min. The polysilicon layer is thereafter structured photolithographically by a dry etching technique (FIG. 3b). Following wet chemical etching of the sacrificial layer, free-standing structures are thus obtained (in the case at hand: polysilicon bridges 10 μm thick; FIG. 3c) having the stress values of the polysilicon layer.

For improving the nucleation or for controlled setting of defined layer characteristics the sacrificial oxide may be provided with a thin CVD polysilicon layer (nucleation layer) prior to the precipitation of the polysilicon.

What is claimed is:

1. A method of fabricating a micromechanical component with at least one free-standing microstructure of predetermined stress, comprising the steps of:
   providing a substrate having a sacrificial layer on a surface thereof;
   applying a polysilicon layer in a reactor by chemical vapor deposition (CVD) on the sacrificial layer at a process pressure of several hundred Pa in a range determinative of the kind of stress and at a process temperature of between 900° C. and 1200° C. determinative of the level of stress of the polysilicon layer.

2. The method of claim 1, wherein for generating compressive stress in the polysilicon layer the process pressure is substantially at atmospheric pressure.

3. The method of claim 1, wherein for generating tensile stress in the polysilicon layer the process pressure is in the range of from about 2.7·10$^3$ to about 13.3·10$^3$ Pa.

4. The method of claim 1, wherein process temperatures in the range of from about 940° C. to about 1,000° C. are used to generate stress in the polysilicon layer of from about 7.5 MPa to about 3.5 MPa.

5. The method of claim 1, wherein the reactor used for the chemical vapor deposition is an epitaxial reactor.

6. The method of claim 1, wherein the reactor used for the chemical vapor deposition is a polysilicon single wafer system.

7. The method of claim 1, further comprising the step of precipitating a thin nucleation layer of polysilicon on the sacrificial layer by low density vapor deposition (LDCVD) prior to applying the stressed polysilicon layer.

8. The method of claim 1, wherein the reaction gas used in the step of applying the stressed polysilicon layer is at least one of silane and dichlorosilane.

9. The method of claim 8, wherein a gas containing at least one of boron and phosphorus is added to the reaction gas.

10. The method of claim 1, further comprising the step of applying at least one additional layer with internal stresses to the polysilicon layer.

11. The method of claim 1, wherein the polysilicon layer has a thickness of $\geq$10 μm.

12. The method of claim 11, wherein the polysilicon layer is applied at a rate in excess of 100 nm/min.

13. The method of claim 12, wherein the step of applying the polysilicon layer is carried out for >20 min.

14. The method of claim 1, wherein the substrate comprises one of monosilicon, ceramics and quartz.

* * * * *

UNITED STATES PATENT AND TRADEMARK OFFICE
CERTIFICATE OF CORRECTION

| | |
|---|---|
| PATENT NO. | : 7,919,345 B1 |
| APPLICATION NO. | : 08/849036 |
| DATED | : April 5, 2011 |
| INVENTOR(S) | : Kirsten et al. |

It is certified that error appears in the above-identified patent and that said Letters Patent is hereby corrected as shown below:

In Column 4, line 63 (Claim 13, line 2) the symbol ">" should read -- < --.

Signed and Sealed this
Seventh Day of February, 2012

David J. Kappos
*Director of the United States Patent and Trademark Office*